Oct. 6, 1970 L. P. SEGAR 3,533,007

DIFFERENCE AMPLIFIER WITH DARLINGTON INPUT STAGES

Filed Oct. 9, 1969

INVENTOR.

LAWRENCE P. SEGAR

BY

ATTORNEY

United States Patent Office 3,533,007

Patented Oct. 6, 1970

3,533,007

DIFFERENCE AMPLIFIER WITH DARLINGTON INPUT STAGES

Lawrence P. Segar, Rochester, Minn., assignor to International Business Machines Corporation, Armonk, N.Y., a corporation of New York Continuation-in-part of application Ser. No. 655,807, July 25, 1967. This application Oct. 9, 1969, Ser. No. 865,156

Int. Cl. H03f 3/68

U.S. Cl. 330—30 7 Claims

ABSTRACT OF THE DISCLOSURE

In the past the Darlington circuit has been used with limited success as the input stage for each side of a difference amplifier. The normal advantages of a Darlington circuit are high gain, high input impedance, lower input current and a high reverse breakdown voltage. These characteristics may be carried over into the difference amplifier at the expense of a higher offset voltage. The offset voltage is the voltage difference between two input signals necessary to obtain the same output voltage from the two output terminals. Thus the offset voltage represents the error voltage in the difference amplifier. When a Darlington circuit is used for each side of the difference amplifier, the offset or error voltage has been eliminated in the past by sacrificing the high reverse breakdown characteristic of the Darlington configuration. On the other hand, in the difference amplifier, shown herein, the offset voltage is greatly reduced and the high reverse breakdown characteristics of the Darlington configuration is preserved. This is accomplished by connecting a voltage drop device between the common emitter connection of the difference amplifier and a current source and by connecting in each Darlington input stage a resistor and diode in series across the series connection of the emitter-base junction of the second transistor with the voltage drop device. The purpose of the resistor and diode is to fix the current out of the first transistor in each Darlington input stage when the difference amplifier is active and to become an open circuit when the Darlington input circuit is reverse biased.

CROSS-REFERENCE TO RELATED APPLICATION

The present application is a continuation-in-part of copending, commonly-owned application Ser. No. 655,807, filed July 25, 1967, and now abandoned.

BACKGROUND OF THE INVENTION

This invention relates to a difference amplifier having Darlington input stages. More particularly this invention relates to an improvement in the biasing of the Darlington input stages whereby the difference amplifier has a very low offset or error voltage and a very high reverse breakdown voltage.

The advantage of using a Darlington input circuit as the input stage for each side of a difference amplifier are (1) high gain, high input impedance, low input current and a high reverse breakdown voltage. However, these advantages are obtained at the cost of a high offset or error voltage, the offset or error voltage being the voltage difference between the input voltages applied to the difference amplifier necessary to produce the same output voltage from each half of the difference amplifier. Ideally, this offset voltage would be 0, and the difference amplifier would then be without error. This has been achieved in the past by matching the voltage from base to emitter in each half of the difference amplifier to the other half. In a Darlington configuration this means that the first transistors or input transistors in each half of the difference amplifier have the same base to emitter voltage drop. Also, the second transistors in each Darlington input stage of the difference amplifier have the same base to emitter voltage drop. The latter is accomplished by driving the transistors with a common current source. The former is accomplished by placing a resistor across the base to emitter junction of the second transistor in each Darlington input stage. The purpose of this resistor is to cause such a large current flow through the first transistor of the Darlington input stages that the current from the first transistor into the base of the second transistor is a small proportion of the current through the first transistor. In this manner the current through the first transistor can be held essentially constant and thus the voltage from base to emitter across the first transistor can be held essentially constant. The input stages can then be matched.

The problem with the prior art is that it sacrifices the high reverse breakdown voltage of the Darlington configuration. If one-half of the difference amplifier becomes back biased, the back bias voltage is applied across the base to emitter junction of the first input transistor via the resistor connected in parallel across the base to emitter junction of the second transistor. Thus the reverse breakdown voltage of this configuration is the reverse breakdown voltage of the first input transistor.

PRINCIPLE OF THE INVENTION

It is an object of this invention to maintain a high reverse breakdown voltage and a low offset or error voltage in a difference amplifier having Darlington input stages.

The above object is accomplished by placing a voltage drop device between the current source and the common emitter connection of the second transistors of the input stages and by placing a unidirectional impedance in each input stage across the series connection of the base to emitter junction of the second transistor with the voltage drop device. The unidirectional impedance conducts current when the transistors in its associated Darlington input stage are active. The amount of current conducted by the impedance is such as to swamp out or dominate the amount of current from the emitter of the first transistor of the Darlington input stage passed to the base of the second transistor in the Darlington input stage so that the current through the first transistor in the Darlington input stage is held essentially constant at the value to which the first transistor in one input stage was matched to the first transistor in the other input stage. The unilateral impedance means is nonconducting or an open circuit when the transistors in its associated Darlington input stage are reverse biased. The voltage-drop device provides the voltage to the unidirectional impedance necessary to cause the dominant current for the first transistor to flow through the unidirectional impedance when the transistors in the Darlington stage are active.

The input stages of the difference amplifier have the advantages of a Darlington circuit, i.e., a high gain, a high input impedance, a low input current and a high reverse breakdown voltage. This high reverse breakdown voltage has been achieved while the offset or error voltage has been held very close to the ideal 0. As an additional fringe benefit, the Darlington configuration with a resistive connection about the base to emitter junction of the second transistor has a higher frequency response than the normal Darlington configuration with no resistance connected about the base to emitter junction of the second transistor. The foregoing and other objects, features and advantages of the invention will be apparent from the following more particular description of a preferred embodiment of the invention, as illustrated in the accompanying drawings.

DESCRIPTION

Figure 1:
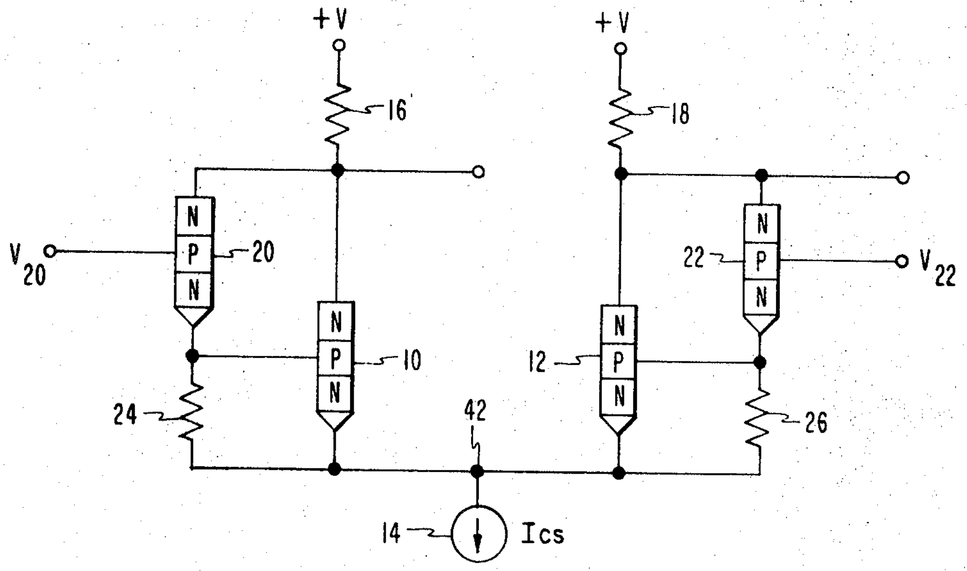
FIG. 1 PRIOR ART
FIG. 1 shows the circuit schematic of a prior art difference amplifier using Darlington input stages where the high reverse breakdown voltage has been sacrificed so as to achieve a low offset or error voltage.

Before describing the invention, reference is made to FIG. 1 wherein the prior-art difference amplifier is shown. The basic difference amplifier is made up of transistors 10 and 12 having their emitters connected in common to current source 14 and their collectors connected respectively to load resistors 16 and 18. (Alternatively, the collectors of transistors 20 and 22 can be connected directly to a voltage source for biasing.) The output from the difference amplifier is taken off of the load resistors 16 and 18. The output may be either single ended (taken off of one of the load resistors) or differential (taken off of both of the load resistors).

The difference amplifier was modified to the Darlington configuration by adding transistors 20 and 22 between the collector and base of transistors 10 and 12 respectively. The purpose of the resistors 24 and 26 connected across the base to emitter junction of transistors 10 and 12 respectively is to achieve a very low offset or error voltage.

The problem with the prior art is best understood by examining the operation of the circuit in FIG. 1. To minimize the offset or error voltage, the base to emitter voltage of transistor 10 is matched to that of transistor 12 while the base to emitter voltage of transistor 20 is matched to that of transistor 22. In each case this must be done at a given equal current flow through the matched transistors. In the case of transistors 10 and 12, they are matched at an equal current flow and equal base to emitter voltage drop, where the current flow will be that expected at the center of the active region of the difference amplifier. In the case of transistors 20 and 22, the current at which the base to emitter voltage drop is matched is selected upon two criteria. The current through the transistor 20 should be much greater than the current into the base of transistor 10 (likewise for transistors 22 and 12) and the current through transistor 20 should be small relative to the current through transistor 10 (likewise for transistors 22 and 12). If these criteria are met, the effect is that the output voltages from the load resistors 16 and 18 are equal when the input voltages $V_{20}$ and $V_{22}$ are equal.

Now as to the operation of the circuit, it is first assumed that there is a small voltage difference between the input voltages $V_{20}$ and $V_{22}$ so that the difference amplifier is operating in its active region. The current source 14 maintains the current from transistors 10 and 12 at a constant level so that when there is a voltage difference across the transistors 10 and 12, approximately half of the voltage difference will be across each transistor. (For this to hold true the current through transistors 20 and 22 passed to the current source via resistors 24 and 26 must be small enough as to not appreciably affect the amount of current being pulled by the current source from transistors 10 and 12.)

The voltage difference results in a slight current decrease in one of the transistors 10 and a slight current increase in the other transistor 12. Assuming the input voltage $V_{20}$ is the more positive voltage, then the current through transistor 10 will slightly increase and the current through transistor 12 will slightly decrease. The current difference through transistors 10 and 12 is then proportional to the voltage difference between input signals $V_{20}$ and $V_{22}$. Over a narrow active region the proportionality is nearly linear.

To avoid the offset voltage or error voltage when the difference amplifier is in the active region, the resistors 24 and 26 act as a current drain on transistors 20 and 22, respectively. Resistor 24 is biased by the base to emitter voltage drop of transistor 10. The resistor 24 has a value so that it conducts a dominant current much greater than the current into the base of resistor 10. Therefore, the current passing through transistor 20 will be essentially the same as the current through resistor 24. Thus, resistor 24 acts to fix the current passing through transistor 20 when the difference amplifier is active. Resistor 26 has the identical effect on transistor 22. Resistors 24 and 26 are fixed at a value so that equal current flow will be passing through transistors 20 and 22 and this previously determined current flow will establish the previously determined match between the base to emitter voltage drop of transistor 20 and transistor 22. In this way the offset or error voltage of the system can be reduced very nearly to 0.

The problem with the difference amplifier in FIG. 1 is that in some applications a difference amplifier may have to take larger voltage swings well out of the active region of the difference amplifier. In these situations a large reverse bias can be placed on each half of the difference amplifier. Normally, a Darlington circuit would have a reevrse breakdown voltage corresponding to the sum of the reverse breakdown voltage of its two transistors. However, in the prior art difference amplifier of FIG. 1, the resistors 24 and 26 essentially bypass the base to emitter junctions of transistors 10 and 12. Therefore, each half of the difference amplifier in FIG. 1 can only take a reverse bias corresponding to the reverse breakdown voltage of transistor 20 or transistor 22. The problem is significantly aggravated by the fact that the magnitude of the reverse bias on the inactive transistor 10 or 12 is significantly increased by the use of the otherwise very desirable current source 14. That is, if the emitters of transistors 10 and 12 were tied to a constant-voltage source, then the voltage drop between the base of each input transistor 20 and 22 and the source is the difference between the respective input voltage ($V_{20}$, $V_{22}$) and the source voltage. Under these conditions, there is rarely any likelihood that the input transistors would be back-biased sufficiently to cause any breakdowns therein. With the use of a constant-current source, however, the emitter voltage of transistors 10 and 12 follows the higher of the two input voltages $V_{20}$ and $V_{22}$. Accordingly, when, e.g., $V_{20}$ is high and $V_{22}$ is low, transistor 20 may have a very large reverse voltage across its base-emitter diode.

Figure 2:
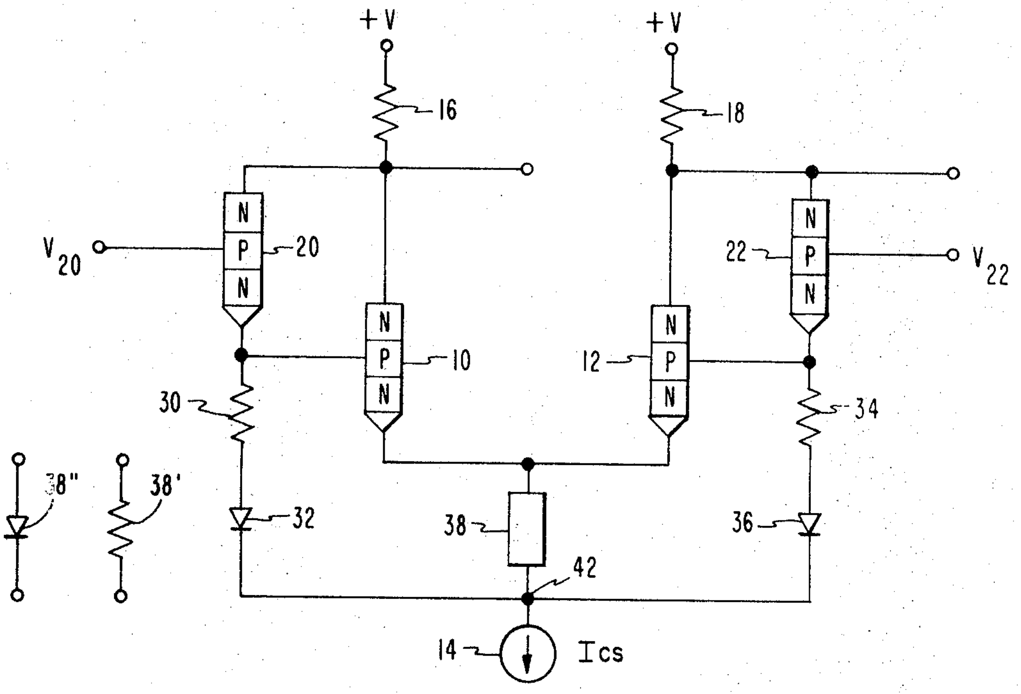
FIG. 2 shows a circuit schematic of the preferred embodiment of the invention where the difference amplifier has a very low offset or error voltage, uses the Darlington configuration for its inputs and preserves the high reverse breakdown voltage characteristic of the Darlington configuration.

Now referring to FIG. 2, it will be shown that with the addition of af few circuit elements, a difference amplifier can be built using Darlington input stages and still maintain a high reverse breakdown voltage while having a very low offset or error voltage. To achieve this the base of transistors 10 and 12 instead of being connected through a resistor to the current source 14 are connected through a unidirectional impedance. The unidirectional impedance, for example, can be a resistance 30 and a diode 32 connected from the base of transistor 10 to the current source 14. Correspondingly, the other half of the difference amplifier would have a similar resistor 34 and diode 36 connected from the base of transistor 12 to the current source.

The purpose of the resistor 30 and diode 32 are to act as a current drain essentially fixing the gross current through transistor 20 when the difference amplifier is operating in its active region. The purpose of the diode 32 is to block reverse current flow when the left half of the difference amplifier (transistors 20 and 10) are reverse biased. Since diode 32 becomes reverse biased in this situation it means that the left half of the difference amplifier can only have a reverse breakdown when the reverse bias voltage on the left half of the difference amplifier exceeds the sum of the reverse breakdown voltages of transistors 10 and 20. The value of resistor 30 must be small in the sense that it is operative to carry a current which is several times the base current of transistor 10; as has been explained, the swamping action mitigates the effects of uncontrollable transistor-parameter variations. On the other hand, it has also been explained that such parameter variations can be eliminated only if the current through transistor 20 is substantially fixed. A relatively large-value resistance is commonly employed as a source of substantially constant current; see, for instant, D. K. Lynn et al., Analysis and Design of Integrated Circuits (1967), page 401; H. C. Lin, Integrated Electronics (1967), page 360; and RCA Linear Integrated Circuit Fundamentals (1966), page 35. Common types of small-signal transistors, both integrated and discrete, allow the satisfaction of both the above criteria with a wide range of resistance values; in the circuit of FIG. 2, R30 values of about 1K–1M ohm, for instance, are entirely satisfactory; 5 K ohm is a convenient typical value. Resistor 34 and diode 36 operate in a similar manner on transistors 12 and 22 when the right half of the difference amplifier is reverse biased. In this way, the difference amplifier has been adapted to take advantage of the Darlington circuit characteristics including a high reverse breakdown voltage. In addition, the very low offset or error voltage has been maintained by controlling the gross current of the transistors 20 and 22 with resistors 30 and 34 when the difference amplifier is operating in its active region. The value of resistor 34 is preferably the same as that of resistor 30.

Another inherent aspect of the present amplifier may be noted at this point. The connection of current source 14 to the emitters of transistors 10 and 12 causes the current through each of these transistors to vary with the voltage difference between the input voltages $V_{20}$ and $V_{22}$. The purpose of resistors 30 and 34, however, is to maintain a relatively constant current through transistors 20 and 22, when they are active, in order to provide better matching; and diodes 32 and 36 reduce the current through these latter transistors to a substantially zero value when they are back-biased. In other words, variations in the voltages $V_{20}$ and $V_{22}$ cause a variable current flow through transistors 10 and 12, but cause a substantially constant current (when inactive) or a substantially zero current (when inactive) through transistors 20 and 22.

In addition to the unidirectional impedance element connected in each half of the difference amplifier a voltage device 38 has been provided between the common emitter junction of transistors 10 and 12 and the terminal 42 of the current source 14. The voltage drop device may be a resistor 38'; it will be apparent that any voltage drop device could be used, such as a diode 38'', a small battery or transistor, etc.

The benefit obtained by using a voltage drop device 38 is best understood by examining what would happen if the common emitters from transistors 10 and 12 were connected directly to the current source 14. In this event, when the difference amplifier was in the active region, the voltage drop across the base to emitter junction of transistors 10 and 12 would correspond approximately to the voltage drop across diodes 32 and 36, respectively, if they were conducting. Thus there is no voltage difference left to drive current through resistors 30 and 34. Accordingly, resistor 38' or forward-biased diode 38'' is added between the common emitter junction of transistors 10 and 12 and the current source 14 so as to provide a voltage drop to drive current through resistors 30 and 34. The resistance of device 38 is small enough to have essentially no effect on the amount of current pulled from transistors 10 and 12 by the current source 14. This condition will be met if the current through device 38 is large in comparison to that through resistors 30 and 34. Accordingly, the equivalent resistance of device 38 should be less than about one-tenth of the value of resistors 30 and 34.

When the above condition is met, it becomes apparent that the voltage drop across device 38 will always remain substantially constant. The source 14 provides a constant current flowing into the node or terminal 42. Since the currents through resistors 30 and 34 are small, the current flowing from terminal 42 into device 38 will remain essentially constant, even when one of the diodes 32 and 36 is back-biased. Therefore, any device 38 whose voltage drop depends upon the current flowing therethrough, such as resistor 38' or diode 38'', will exhibit an essentially constant voltage drop thereacross. The present amplifier, therefore, may be characterized as having a substantially constant current in resistors 30 and 34, but a substantially constant voltage in device 38.

To review, the preferred embodiment of the difference amplifier shown in FIG. 2 has maintained a low offset or error voltage while also preserving the high reverse breakdown voltage characteristic of a Darlington input stage. This has been accomplished by a unidirectional impedance element (resistor 30 and diode 32) and a bias impedance element or voltage drop device 38. It will be apparent to one skilled in the art that many semiconductive devices could be used to produce the functions of the unidirectional impedance element and the voltage drop device.

While the invention has been particularly shown and described with reference to a preferred embodiment thereof, it will be understood by those skilled in the art that various changes in form and details may be made therein without departing from the spirit and scope of the invention.

What is claimed is:

1. In a differential amplifier including a plurality of Darlington stages each accepting an input voltage signal and having an emitter of a first transistor coupled to a base of a second transistor, said amplifier further including a constant-current source having a terminal coupled to an emitter of both said second transistors so as to provide a variable current through each said second transistor in response to a varying voltage difference between said input signals, the improvement comprising:

unidirectional impedance means in each said stage coupled from said constant-current source terminal to said first-transistor emitter for conducting current when said first transistor is active and for blocking all appreciable current flow through said first transistor when said first transistor is reverse-biased; and voltage dropping means coupled from said constant-current source terminal to said second-transistor emitters.

2. A differential amplifier according to claim 1, wherein each said unidirectional impedance means includes means for conducting a substantially fixed current therethrough when said first transistor is active.

3. A differential amplifier according to claim 1, wherein each said unidirectional impedance means includes means for limiting the current conducted therethrough when said first transistor is active to a magnitude which is small relative to the current from said constant-current source.

4. A differential amplifier according to claim 1, wherein each said unidirectional impedance means comprises a resistor and a diode connected in series with each other so as to limit the current flow through said first transistor to the leakage current of said diode when said first transistor is not active.

5. A differential amplifier according to claim 1, wherein said voltage dropping means includes means for maintaining a substantially constant voltage drop thereacross.

6. A differential amplifier according to claim 1, wherein said voltage dropping means comprises a resistor.

7. A differential amplifier according to claim 1, wherein said voltage dropping means comprises a forward-biased diode.

References Cited

UNITED STATES PATENTS

| | | | |
|---|---|---|---|
| 3,192,399 | 6/1965 | Ih | 307—315 X |
| 3,310,688 | 3/1967 | Ditkofsky | 330—30 X |
| 3,378,780 | 4/1968 | Lin | 330—24 |

ROY LAKE, Primary Examiner

L. J. DAHL, Assistant Examiner

U.S. Cl. X.R.

307—315; 330—24